United States Patent [19]
Fisher et al.

[11] Patent Number: 5,936,758
[45] Date of Patent: Aug. 10, 1999

[54] METHOD OF PASSIVATING A MICROMECHANICAL DEVICE WITHIN A HERMETIC PACKAGE

[75] Inventors: Edward C. Fisher, Lucas; Ronald Jascott, Plano; Richard O. Gale, Allen, all of Tex.

[73] Assignee: Texas Instruments Incorporated, Dallas, Tex.

[21] Appl. No.: 09/075,809

[22] Filed: May 11, 1998

Related U.S. Application Data

[60] Provisional application No. 60/015,185, Apr. 12, 1996.

[51] Int. Cl.$^6$ .................................................. G02B 26/08
[52] U.S. Cl. ........................... 359/224; 359/900; 257/704
[58] Field of Search ..................... 359/224, 900; 257/678, 680, 687, 701, 702, 704

[56] References Cited

U.S. PATENT DOCUMENTS 5,293,511  3/1994  Poradish et al. ..................... 257/434

OTHER PUBLICATIONS

Pending Application entitled "Micromechanical Device Including Time–Release Passivant", Serial Number 08/833,166 filed Apr.3, 1997, Inventors—Homer B. Klonis, et al.

*Primary Examiner*—James Phan
*Attorney, Agent, or Firm*—Charles A. Brill; Frederick J. Telecky, Jr.; Richard L. Donaldson

[57] ABSTRACT

A method of passivating a hermetically sealed micromechanical device (14) with a passivant (100). A predetermined quantity of the passivant (100) is placed within the cavity (54) of a lid (42) after the lid and package base (46) have been activated. Thereafter, by heating the package (10) including the passivant, the passivant will sublime within the hermetically sealed package (10) to provide a monolayer of passivant across the active surfaces of the micromechanical die (14). An improved hermetic seal is achieved since the passivant is sublimed after the laser weld process. In addition, the effectiveness of the passivation process is improved since the passivation is performed after the package is sealed, without the risk of any impurities entering into the package to degrade the effectiveness of the passivation.

9 Claims, 2 Drawing Sheets

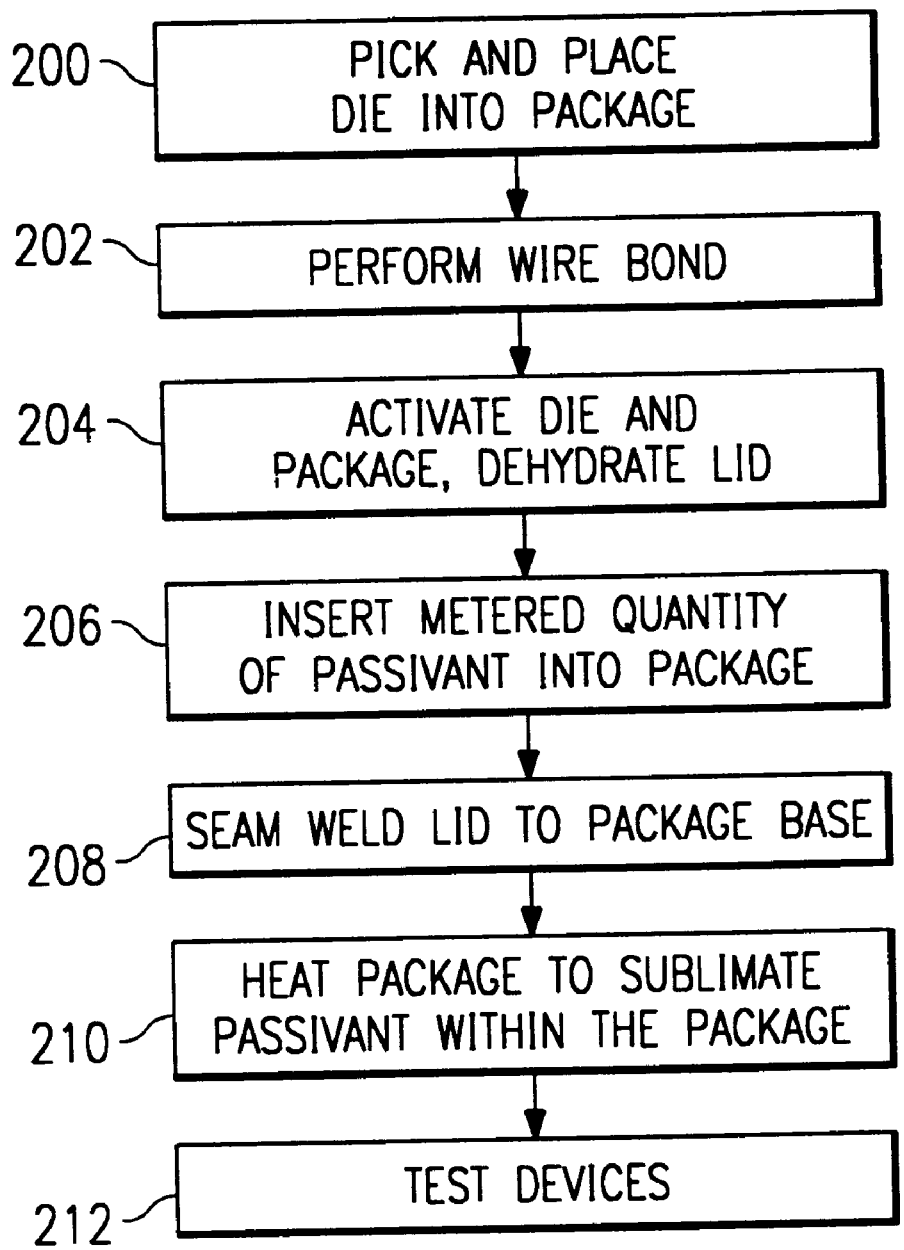

METHOD OF PASSIVATING A MICROMECHANICAL DEVICE WITHIN A HERMETIC PACKAGE

CROSS REFERENCE TO RELATED APPLICATIONS

This application claims priority under 35 U.S.C. §to 119 (e) (1) of provisional application number 60/047,557 filed May 22, 1997.

Cross reference is made to the following co-pending patent applications, each being assigned to the same assignee as the present invention and the teachings included herein by reference:

| SERIAL NUMBER | TITLE | FILING DATE |
| --- | --- | --- |
| 08/311,480 | Manufacturing Method for Micromechanical Devices | 08/23/94 |
| 60/015,185 | Micromechanical Device Including Time-Release Passivant | 04/12/96 |

FIELD OF THE INVENTION

This invention relates to improved micro-mechanical devices and to a method for producing such improved devices. More particularly, the present invention relates to micro-mechanical devices having relatively selectively movable elements which may engage or contact, any tendency of the engaged or contacted elements to stick, adhere or otherwise resist separation being ameliorated or eliminated in the improved device through the use of the method according to this invention. The present invention relates to an improved micromechanical device, including micromechanical devices such as actuators, motors, sensors, and more specifically, a spatial light modulator (SLM), and more particularly, to a packaged SLM of the digital micromirror device ("DMD") variety having improved operating characteristics.

BACKGROUND OF THE INVENTION

SLM's are transducers that modulate incident light in a spatial pattern pursuant to an electrical or other input. The incident light may be modulated in phase, intensity, polarization or direction. SLM's of the deformable mirror class include micromechanical arrays of electronically addressable mirror elements or pixels which are selectively movable or deformable. Each mirror element is movable in response to an electrical input to an integrated addressing circuit formed monolithically with the addressable mirror elements in a common substrate. Incident light is modulated in direction and/or phase by reflection from each element.

As set forth in greater detail in commonly assigned U.S. Pat. No. 5,061,049 to Hornbeck, deformable mirror SLM's are often referred to as DMD's (for "Deformable Mirror Device" or "Digital Micromirror Device") and are manufactured by Texas Instruments of Dallas Tex. There are three general categories of deformable mirror SLM's: elastomeric, membrane and beam. The latter category includes torsion beam DMD's, cantilever beam DMD's and flexure beam DMD's.

Each movable mirror element of all three types of beam DMD includes a relatively thick metal reflector supported in a normal, undeflected position by an integral, relatively thin metal beam. In the normal position, the reflector is spaced from a substrate-supported, underlying control electrode which may have a voltage selectively impressed thereon by the addressing circuit.

When the control electrode carries an appropriate voltage, the reflector is electrostatically attracted thereto and moves or is deflected out of the normal position toward the control electrode and the substrate. Such movement or deflection of the reflector causes deformation of its supporting beam storing therein potential energy which tends to return the reflector to its normal position when the control electrode is de-energized. The deformation of a cantilever beam comprises bending about an axis normal to the beam's axis; that of a torsion beam comprises deformation by twisting about an axis parallel to the beam's axis; that of a flexure beam, which is a relatively long cantilever beam connected to the reflector by a relatively short torsion beam, comprises both types of deformation, permitting the reflector to move in piston-like fashion. Thus, the movement or deflection of the reflector of a cantilever or torsion beam DMD is rotational with some parts of the reflector rotating toward the substrate; other parts of the reflector rotate away from the substrate if the axis of rotation is other than at an edge or terminus of the reflector. The movement or deflection of the reflector of a flexure beam DMD maintains all points on the reflector generally parallel with the substrate.

When the reflector of a beam DMD is operated in binary fashion by its addressing circuit, it occupies one of two positions, the first being the normal position which is set by the undeformed beam, the second position being a deflected position. In one of the positions, the reflector reflects incident light to a selected site, such as a viewing screen, the drum of a xerographic printer or other photoreceptor. In the other position, incident light is not reflected to the photoreceptor, and may be reflected to a light absorber.

A typical DMD includes an array of numerous pixels, the reflectors of each of which are selectively positioned to reflect or not reflect light to a desired site.

Because a potential difference must exist between the reflector and the control electrode to deflect the reflector, it is undesirable for these two elements to engage. Engagement of a deflected reflector and its control electrode effects current flow therethrough which may weld them together and/or cause the thinner beam to melt or fuse. In either event the functionality of the involved pixel is destroyed. In response to the foregoing problem, a landing electrode may be associated with each reflector. Typically, in the case of a cantilever- or torsion-beam DMD, the landing electrode resides on the substrate at a greater distance from the rotational axis than the control electrode, both distances being taken parallel to the reflector in its normal position. In a flexure-beam DMD, the top of the landing electrode may be elevated above the top of the control electrode. In view of the foregoing, the deflected reflector ultimately engages the landing electrode, but not the control electrode. To prevent damage to the reflector, the landing electrode is maintained at the same potential as the reflector. Again, see commonly assigned U.S. Pat. No. 5,061,049.

Notwithstanding the use of a landing electrode, it has been found that a deflected reflector will sometimes stick or adhere to its landing electrode. Such sticking or adherence may prevent the energy stored in the deformed beam from returning or "resetting" the reflector to its normal position after the control electrode is de-energized. It has been postulated that such sticking is caused by welding or intermolecular attraction between the reflector and the landing electrode or by high surface energy substances sorbed deposited on the surface of the landing electrode and/or on the portion of the reflector which contacts the landing electrode. Substances which may impart high surface energy to the reflector-landing electrode interface include water vapor and other ambient gases (e.g., carbon monoxide, carbon dioxide, oxygen, nitrogen), and gases and organic components resulting from or left behind following production of the DMD, including gases produced by outgassing from UV-cured adhesives which mount a protective cover to the DMD. A protective cover and other DMD "package" is disclosed in commonly assigned U.S. Pat. No. 5,293,511 entitled "Package for a Semiconductor Device", the teachings of which are incorporated herein by reference.

Sticking of the reflector to the landing electrode has been overcome by applying selected numbers, durations, shapes and magnitudes of voltage pulses ("reset signals") to the control electrode. One type of reset signal attempts to further attract a reflector toward its landing electrode, which the reflector already engages. This further attraction stores additional potential energy in the already deformed beam. When the control electrode is de-energized, the increased potential energy stored in the beam is now able to unstick the reflector from the landing electrode and return the reflector to its normal position. A variant reset signal comprises a train of pulses applied to the control electrode to induce a resonant mechanical wave in a reflector already engaging a landing electrode. De-energizing the control electrode as a portion of the reflector is deformed away from the landing electrode unsticks the reflector. For more details concerning the foregoing and other unsticking techniques, see commonly assigned U.S. Pat. No. 5,096,279 and co-pending patent application Ser. No. 08/311,480, entitled "Manufacturing Method for Micromechanical Devices" filed Sep. 23, 1994, the teachings incorporated herein by reference.

There is disclosed in commonly assigned patent application Ser. No. 60/015,185 entitled MICROMECHANICAL DEVICE INCLUDING TIME-RELEASE PASSIVANT a micromechanical device having an enclosed source time-releasing passivant implementing a molecular sieve or binder that is impregnated with a passivant. Over time, the molecular sieve or binder will time release the passivant to continuously coat the surfaces of the engaging elements. By continuously coating the surfaces of the engaging elements, the tendency for contacting elements to stick, adhere or otherwise resist separation is ameliorated or eliminated continuously over time.

One approach to passivating the contacting surfaces of a micromechanical device includes placing a die into a package, then activating the die and package together such as using a plasma etch process, and separately dehydrating the transparent lid or window by baking the lid in a vacuum. Thereafter the die and package are together passivated, with the lid being passivated separately. Then, the passivated lid is seam welded to the package to provide a hermetic seal. The assembled package is then baked for an extended period of time. The cycle time for this approach is rather lengthy, typically facilitating about 6 packages to be passivated and assembled every 2 hours. In addition, welding passivated surfaces is very difficult, and may emit an undesirable bi-product into the package cavity, thus degrading the effectiveness of the subsequent passivation. Using this approach, there is uncertainty as to the exact amount of passivant that is inside the package, whereby a single monolayer on each of the metal surfaces is desired. Further, the oven is contaminated as it is exposed after the activation process and during the passivation process. There is the additional requirement of device handling in and out of Petri dishes. Other problems include the inability to control passivation position relative to the die, and the extensive related fixturing and handling of the separated package lid from the package.

In commonly assigned U.S. Pat. No. 5,331,454 entitled "Low Reset Process for DMD", there is disclosed a technique for passivating or lubricating the portion of the landing electrode engaged by the deformed reflector, and/or the portion of the deformed reflector which engages the landing electrode, so that sticking or adherence therebetween is reduced or eliminated. Passivation is effected by lowering the surface energy of the landing electrode and/or the reflector, which is, in turn, effected by chemically vapor-depositing on the engageable surfaces of interest a monolayer of a long-chain aliphatic halogenated polar compound, such as a perfluoroalkyl acid. This acid is characterized by a chain having an $F_3C$ molecule at a first end, a COOH molecule at the second end, and intermediate $CF_2$ molecules. The COOH end becomes firmly attached to surfaces of the DMD—following pretreatment of such surfaces, if necessary, to achieve same—to present the very low surface energy $F_3C$ and $CF_2$ molecules for engagement. The application of such a compound to at least that portion of the landing electrode which is engaged by a deformed reflector has resulted in an amelioration of the sticking or adhesion problem.

Objects do not easily, if at all, stick or adhere to low energy surfaces, which are also usually expected to be resistant to sorption thereonto of the above-discussed high-surface-energy-imparting substances, such as water vapor. However, while DMD's on which the above-described anti-stick monolayer has been deposited initially exhibit little, if any, reflector-electrode adherence—as evidenced by the low magnitudes of reset signals—after time, higher magnitudes of reset signals are required. Similarly, when protective, light-transparent covers are mounted to DMD's with adhesives, such as UV-cured epoxies, a need to increase the magnitude of reset signals over time has been noted. A similar effect has also been noted in DMD's after several hours of "burn-in." The foregoing suggests that substances—in the first case from the ambient, in the second case outgassed from the adhesive, in the third case outgassed from the DMD—are adhering to or becoming incorporated into the low surface energy anti-stick deposit, possibly due to defects or discontinuities in the films (or coatings) thereof.

There is desired an improved method which is simple and effective to passivate contacting surfaces of a micromechanical device.

SUMMARY OF THE INVENTION

The present invention achieves technical advantages as a method of passivating a micromechanical device by placing a predetermined quantity of a passivant in a package just after device activation, and then immediately welding a hermetic lid to the package, whereby the passivant will sublimate inside the hermetic package. The present invention achieves technical advantages as the seal ring and package lid will be clean i.e. free of passivant during a seam or laser welding process. This approach reduces the chance of undesirable bi-products being introduced into the package cavity, and also the chance of lids slipping and damaging bond wires during the weld process. Several hundred packages can be assembled and concurrently passivated using a standard convection oven, thereby increasing the thruput of the packaging process. The passivation amount can be tightly controlled and optimized for best device performance since the partial pressures and the packaging volume are a constant. Contamination and particulates from ovens are no longer a factor since the lids are hermetically sealed after device activation and before the device is placed into an oven for the passivation process. In addition, the devices no longer need to be handled for placing into and out of the Petri dishes for passivation. Position of the passivation relative to the die to be passivated can be tightly controlled inside the package. Passivation of the lid window, separate from the package, is not necessary as both are passivated simultaneously.

BRIEF DESCRIPTION OF THE DRAWINGS

FIG. 2 is a flow diagram of the method according to the present invention for passivating a micromechanical device within a hermetically sealed package.

DESCRIPTION OF THE PREFERRED EMBODIMENT

Figure 1:
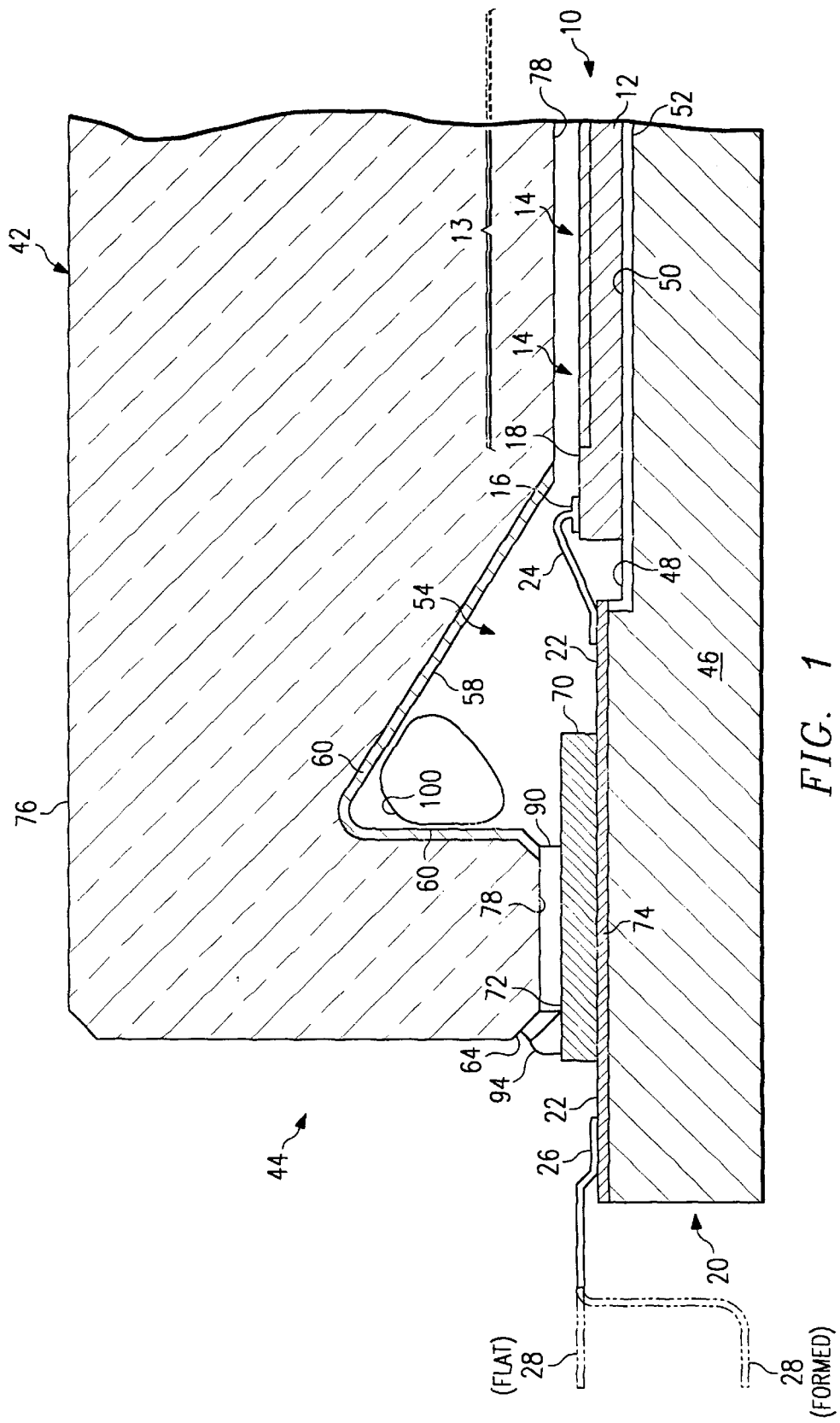
FIG. 1 is a sectional side view of a micromechanical device, such as a DMD spatial light modulator, hermetically sealed within a package after activation, the sealed package including a predetermined quantity of a passivant, the assembled package then being placed in a typical convection oven for baking to cause the passivant to sublimate and passivate the active surfaces of the micromechanical device.

Referring first to FIG. 1, there is shown a micromechanical device 10 which is formed on and in a semiconductor chip 12 sawed from a wafer (not shown). Numerous such chips 12 are sawed from the wafer, as is well known. The chip 12 includes an array 13 of active sites, generally indicated at 14, and one or more associated bond pads 16. The bond pads 16 are electrically continuous with their active cites 14 via conductors 18 deposited on the wafer. The conductors 18 may be produced by some of the same procedures which produce the active sites 14 and are electrically continuous therewith. The bond pads 16 are typically formed on, and in electrical continuity with, appropriate one of the conductors 18. Ultimately, each chip 12 is mounted to a header 20 and the bond pads 16 are rendered electrically continuous with conductive lands 22 on the header 20 by bonding wires 24 to and between the pads 16 and the lands 22. The conductive lands 22 may, inturn, be connected to the individual leads 26 of a frame 28, again as is well known in the art. The active sites 14 may each include a digital micromirror device (DMD) or other micromechanical device. Preferred DMDs include those of the type shown in commonly assigned U.S. Pat. No. 5,061,049 to Hornbeck. The DMD includes an area array of reflective, deflectable beams and associated circuit components which function as addressing circuits for selectively deflecting the beam. Preferred methods for monolithically forming the beams and circuit components are setforth in the '049 patent to Hornbeck. Typically, the beams deflect or rotate on one or more hinges or torsion members. An undercut well is formed in a layer of the chip 12 beneath each beam to accommodate deflection. Deflection of the beam is effective by an attractive force exercised thereon by an electric field resulting from a potential between the beam and an address electrode located in the well under the beam. The electrodes potential is produced by the associated circuit components whereby the beam and electrodes are electrically continuous. Still referring to FIG. 1, the micromechanical package 10 is seen to include a cover 42 and a base 46 made of molded ceramic material. The ceramic base 46 has a cavity 48 formed therein, whereby the floor 50 of the cavity serves as a precision mounting surface for the chip 12. The cover 42 defines an annular groove 54 which groove surface is covered with a light-reflective coating 60.

The cover 42 is preferably mounted to the base 46 via an intermediate glass seal ring 70. The seal ring 70 is a thin, planner, generally annular member having a shape which is similar to the shape of the periphery of the cover 42. The seal ring 70 is made of glass or a similar material which can be polished to high optical flatness. Ring 70 is fused to the base 46 (and the lands 22 thereon), preferably by the application of heat. The interface 72 of the seal ring 70 is fusion bonded or laser welded to the lower face 78 of cover 42 at and near the outer periphery thereof. Alternatively, lid 42 can be hermetically sealed to the base member 46 using solder, shown at 90. The outer peripheral portion of the lower face 78 of the cover 42 and the upper surface 72 of the seal ring 70 receive a solder-wettable metallic coating. A radiant energy is applied to melt the solder and hermetically seal the lid 42 to seal ring 70 and thus to the base member 46.

For additional details and discussion of the package described so far, cross reference is made to commonly assigned U.S. Pat. No. 5,293,511 the teachings of which are incorporated herein by reference.

According to the preferred embodiment of the present invention, a predetermined quantity of a passivant 100 is shown to be positioned within annular groove 54 for passivating the activated surfaces of the micromechanical device 14 immediately after the lid 42 is hermetically sealed to the base member 46. The predetermined quantity of the passivant 100 is preferably provided in a pill form, as shown, although the quantity of the passivant 100 may be metered out in other forms, such as in granular form, and disposed in the interior of the package 10, as shown.

The passivant is metered out to a quantity that is known to provide a monolayer to each of the activated surfaces of the micromechanical device 14. As will be discussed shortly in regards to FIG. 2, the metal surfaces of the micromechanical device 14 are first activated by a plasma etch process, or a combination of a plasma etch/UV exposure to remove contaminants including organics and other impurities. The glass lid 42 is separately dehydrated by baking in a vacuum to remove impurities therefrom. The predetermined quantity of passivant 100 is placed within the opening 54, and the lid 42 hermetically welded or fused to the seal ring 70 of base member 46. Thereafter, the entire device 10 is heated for an extended 24 hour period of time at 100° Celsius such as in a convection oven, causing the passivant 100 to sublimate within the device package 10 and coat the active metal surfaces of device 14 with a monolayer of the passivant 100.

The present invention achieves technical advantages in that the package seal ring 70 and the lid 42 will be clean and free of passivants during the seam or laser welding process. This reduces the chance of undesirable bi-products being introduced into the package cavity, and also reduces the chance of the lid 42 slipping and damaging the bond wires 24 during the weld process. The passivation of the active surfaces of the micromechanical device 12 can be tightly controlled and optimized for best device performance since the partial pressures and the package volume are a constant. Contamination and particulates from the convection oven is no longer a factor since the lid 42 is hermetically sealed before the device 10 is placed in the convection oven for the passivation process. The device 10 does not need to be handled and placed into or out of a Petri dish during passivation. The position of the passivation 100 relative to the die 12 is tightly controlled inside the package. Passivation of the lid 42 and the micromechanical device 12 is accomplished simultaneously.

Referring now to FIG. 2, there is shown a detailed flow diagram of the passivation process according to the preferred embodiment of the present invention. At step 200, automated packaging equipment picks and places micromechanical die 12 onto the mounting surface 50 of cavity 48 defined in base member 46. The micromechanical circuit 12 is securely adhered to floor 50 using a suitable thermally conductive adhesive.

At step 202, automated equipment preforms wire bond to attach wire bonds 24 between the die 12 and the lands 22.

At step 204, die 12 is activated using a plasma etch, or combination of a plasma etch/UV cure process to remove contaminates including organics from the surfaces of the base member 46 and the surfaces of die 12. Separately, the lid 42 is dehydrated by baking the lid in a vacuum to remove any impurities.

At step 206, a metered quantity of the passivant 100 is inserted into the cavity of the package, preferably the annular groove 54 of the lid 42. While the passivant is preferably provided in pill form, other compositions can include granular form if desired. Preferably, a quantity of passivant 100 is metered out to be sufficient to provide a monolayer of the passivant to the active surfaces of the die 12 when sublimated. Preferred passivants can include perfluordecanoic acid (PFDA), perfluoropolyether (PFPE), or other suitable passivants which can provide a monolayer to the active surfaces of die 12. For additional discussion of the use of PFDA and PFPE, cross reference is made to commonly assigned U.S. Pat. No. 5,331,454 to Hornbeck, a and U.S. Pat. No. 5,512,374 to Wallace, the teachings of which are incorporated herein by reference.

At step 208, the package lid 42 is seam welded or laser welded to the seal ring 70 of package base 46. This seam weld or laser weld process is performed immediately after the activation of the base 46 and the die 12, and after dehydrating the lid 42. The welding of the lid to the package is performed in a dry box that is in a controlled and very dry environment of mostly $N_2$ with approximately 5% Helium. The Helium is detected in subsequent leak check points to ensure hermetic integrity. It is critical that the welding is performed as soon as possible to preserve the cleanliness of the activated surfaces.

At step 210, the entire assembled package 10 is then placed in the convection oven and heated to a temperature of 100° Celsius for a 24 hour period. This causes the metered quantity of passivant 100 to sublimate within the package and provide a monolayer of the passivant to the active surfaces of die 12, particularly the engaging surfaces of the micromechanical device 14. Thus, the entire interior of the device 10, including the contacting surfaces of die 12 are all passivated at the same time, uniformly, and without the possibility of any impurities degrading the quality and effectiveness of the passivant. Since the surfaces to be passivated are pristine, the passivation is very effective. While it is preferable to provide only a quantity of passivant 100 that is sufficient to provide a monolayer of passivant to all the surfaces within the interior of device 10, a slightly larger quantity of passivant 100 could be metered out to provide for continuous passivation over the lifetime of the device if desired.

At step 212, the devices 10 are tested to insure functional operation of the passivated devices.

In summary, there is disclosed a method of providing a predetermined quantity of passivant within a hermetically sealed micromechanical device, and then simultaneously passivating the active surfaces of the micromechanical device. The present invention allows hermetically sealing the lid to the base member of the package without the risk of a passivant degrading the effectiveness of the laser seal, and without the risk of introducing impurities onto the engaging surfaces of a micromechanical device during the laser weld process. Devices can be passivated at a very high throughput, thus reducing the cost of the overall process.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A method rendering passive a surface of a micromechanical device, comprising the steps of:

a) placing said micromechanical device in a package;

b) placing a predetermined quantity of a passivant in said package;

c) sealing said micromechanical device and said passivant from the ambient; and d) activating said passivant to passivate said micromechanical device with said passivant to render said micromechanical device passive.

2. The method as specified in claim 1, comprising the step of attaching a lid to said package to seal said micromechanical device from the ambient.

3. The method as specified in claim 1 comprising the step of hermetically sealing said micromechanical device in said package in said step c).

4. The method as specified in claim 1 comprising the step of placing said passivant in said step b) of the type that sublimates in said package when activated.

5. The method as specified in claim 1 wherein said micromechanical device comprises a DMD having a deflectable member engaging a landing surface, said passivant passivating said landing surface.

6. The method as specified in claim 1 wherein said passivant comprises PFDA.

7. The method as specified in claim 1 wherein said passivant is in pill form when placed in said package.

8. The method as specified in claim 1 wherein said passivant comprises a granular material when placed in said package.

9. The method as specified in claim 1 wherein said passivant forms a monolayer across said micromechanical device in said step d).

* * * * *